United States Patent [19]
Carline et al.

[11] Patent Number: 6,111,266
[45] Date of Patent: Aug. 29, 2000

[54] SEMICONDUCTOR SUBSTRATE FOR REFLECTING ELECTROMAGNETIC RADIATION WITHIN A WAVELENGTH RANGE

[75] Inventors: Roger T Carline; David J Robbins, both of Malvern, United Kingdom

[73] Assignee: The Secretary of State for Defence in Her Britannic Majesty's Government of the United Kingdom of Great Britain and Northern Ireland, Farnborough, United Kingdom

[21] Appl. No.: 08/952,006

[22] PCT Filed: Jun. 4, 1996

[86] PCT No.: PCT/GB96/01324

§ 371 Date: Nov. 7, 1997

§ 102(e) Date: Nov. 7, 1997

[87] PCT Pub. No.: WO96/39719

PCT Pub. Date: Dec. 12, 1996

[30] Foreign Application Priority Data

Jun. 5, 1995 [GB] United Kingdom .............. 9511336

[51] Int. Cl.⁷ ..................... H01L 29/06; H01L 31/0232
[52] U.S. Cl. ............. 257/14; 257/19; 257/21; 257/22; 257/432; 257/436
[58] Field of Search ................... 257/14, 21, 22, 257/94, 96, 98, 431, 432, 436, 19; 250/338.3, 332

[56] References Cited

FOREIGN PATENT DOCUMENTS 0 622 857  11/1994  European Pat. Off. .

OTHER PUBLICATIONS

B.F. Levine, "Quantum–well infrared photodetectors", J. Appl. Physics 74 (8), Oct. 15, 1993.

R. Kuchibhotla et al, "$GE_{0.2}Si_{0.8}$/Bragg–reflector mirrors for optoelectronic device applications", Appl. Phys, Lett. 62 (18), May 3, 1993.

V.P. Kesan et al, "Si/SiGe heterostructures grown on SOI substrates by MBE for integrated optoelectronics", Journal of Crystal Growth, 111 (May 1991).

D.K. Nayak et al, "Photoluminescence of Si/SiGe/Si quantum wells on separation by oxygen implantation substrate" Appl. Phys. Lett. 64 (18), May 2, 1994.

Applied Physics Letters, Dec. 12, 1994, USA, vol. 65, No. 24, ISSN 0003–6951, pp. 3039–3041, XP000485921 Fukatsus et al: "Special modulation of luminescence of strained $Si/sub\ 1-x/Ge/sub\ s//Si$ quantum wells in a vertical cavity with air/Si and $Si/Sio/sub\ 2$/interface mirrors" cited in the applicaton see the whole document.

Journal of Crystal Growth, vol. 111, No. 1/4, May 2, 1991, pp. 936–942, XP000298474 Kesan V P et al: Si/SiGe Heterostructures Grown on SOI Substrates by MBE for Integrated Optoelectronics: cited in the application see the whole document.

Photodetectors: Materials and Devices, San Jose, CA, USA, Feb. 1–2, 1996, vol. 2685, ISSN 0277–786X, Proceedings of the SPIE—The International Society for Optical Engineering, 1996, SPIE–Int. Soc. Opt. Eng, USA, pp. 188–194, XP000602727 Robbins D J et al: "Silicon–based resonant cavity detectors for long–wave infrared imaging" see the whole document.

Applied Physics Letters, Jan. 22, 1996, AIP, USA, vol. 68, No. 4, ISSN 0003–6951, pp. 544–546, XP000556076 Carline R T et al: "Long–wavelength SiGe/Si resonant cavity infrared detector using a bonded silicon–on–oxide reflector" see the whole document.

*Primary Examiner*—Minh Loan Tran
*Attorney, Agent, or Firm*—Nixon & Vanderhye P.C.

[57] ABSTRACT

A semiconductor substrate, suitable for epitaxial growth thereon, comprising a plurality of layers of material. The interfaces between layers act as reflectors of electromagnetic radiation. The reflectors may be used in, for example, resonant cavities in which may be located, for example, multi-quantum well detectors, the efficiency of said detectors being increased by virtue of the enhanced electric field associated with resonance in the cavity.

7 Claims, 6 Drawing Sheets

TOP ILLUMINATED

SUBSTRATE ILLUMINATED

SEMICONDUCTOR SUBSTRATE FOR REFLECTING ELECTROMAGNETIC RADIATION WITHIN A WAVELENGTH RANGE

BACKGROUND OF THE INVENTION

1. Field of the Invention

The current invention relates to a method of realising reflectors of electromagnetic radiation in semiconductor substrates upon which high quality epitaxy can be grown. These substrates may be used to produce a resonant cavity for electromagnetic radiation: such cavities are of importance for applications such as laser etalons and infrared photon detectors.

2. Discussion of Prior Art

Infrared detectors are of importance for both civilian and military applications. Where radiation is transmitted through the atmosphere the useful wavelength ranges are limited to $[3-5] \times 10^{-6}$ m and $[7.5-14] \times 10^{-6}$ m by atmospheric absorption. For military applications the long wavelength range may be further limited to about $[7.5-9] \times 10^{-6}$ m by filters designed to avoid dazzle by $CO_2$ lasers. Focal plane arrays (FPAs) with many individual detector elements are used for imaging in both these ranges. Several technologies are available for FPAs in the $[3-5] \times 10^{-6}$ m range eg CdHgTe (CMT) or InSb hybridised to Si readout circuits, or monolithic arrays. The technology is less well developed in the $[7.5-14] \times 10^{-6}$ m range. CMT is difficult to grow with the uniformity required for long wavelength infrared (LWIR) FPAs and requires cold bonding to the Si readout circuit which makes fabrication more difficult. Multi Quantum Well (MQW) detectors using GaAs/AlGaAs have progressed to 128×128 arrays using solder bump technology to hybridise to a Si readout chip but with unknown yield for larger arrays (B. F. Levine. J. Applied Physics 74 R1 (1993)). High performance FPAS are typically operated at temperatures close to that of liquid nitrogen. The thermal mismatch between detector and readout chips limits the size of hybrid arrays using compound semiconductor detectors on Si readout circuits. There is no successful Si monolithic LWIR FPA technology; IrSi, which has a long wavelength infrared response has low quantum efficiency and therefore very low operating temperature.

At present LWIR technologies are being developed which are compatible with the Si readout circuits to avoid limitations inherent in the hybrid approach using compound semiconductor detectors. Of these the use of pseudomorphic heterostructures formed from silicon-germanium alloys epitaxially grown on Si substrates (SiGe/Si) is the most promising. Pseudomorphic SiGe/Si has the advantage of allowing a very high degree of uniformity over the Si substrate wafer which minimises fixed pattern noise in the FPA and favours high manufacturing yield.

LWIR photon detectors made from SiGe/Si MQWs are limited by low responsivity and by dark current thermal noise. Devices must be operated at lower temperatures to give acceptable signal/noise ratios. This restricts the utility and increases the cost of the imaging system. An increase in the quantum efficiency for absorption of incident radiation should improve the signal/noise ratio and so allow operation at higher temperature.

The quantum efficiency of detectors at shorter wavelengths ($<2 \times 10^{-6}$ m) has been enhanced using resonant cavities (see eg R Kuchibhotla, J Campbell. J C Bean, L Peticolas and R Hull, Appl. Phys. Lett 62 2215 (1993)). Resonant cavities produce localised regions of high electric field. Where absorption is dependent on the electric field the quantum efficiency can be enhanced by locating the absorbing region of a device in a resonant cavity.

To produce such a resonant cavity, the incident radiation wavelength $\lambda$, is confined between two reflectors. Electric field enhancement in the cavity increases as the reflectances of the confining mirrors at wavelength $\lambda$ increase. For a cavity of width $L_c$ and refractive index n, light confined in the cavity resonates at wavelengths determined by optical thickness $nL_c/\lambda$, and the phase changes at the confining mirrors. Hence the cavity width, as well as the wavelength-dependence of the reflectors, must be chosen carefully to match $\lambda$. Provided the reflectors and absorption region are sufficiently broad-band, resonances at more than one wavelength may be used.

The reflectors used in resonant cavities are often dielectric or semiconductor stacks which consist of a large number of pairs of layers with refractive indices $n_1$ (higher than n for the cavity) and $n_2$ (lower than n for the cavity) and with individual layer thicknesses $\lambda/4n_i$ (where i=1 or 2). An important property of such reflectors is their high transmission of incident light to allow penetration of the stacks and the cavity. Use of such Bragg reflectors for LWIR applications is limited, however, by difficulties in producing high quality pairs of thick layers to match the large wavelength. When one of the layers is strained, as for SiGe/Si, defects are introduced by strain relaxation in thick layers which reduce the efficiency of the Bragg reflector.

Semiconductor resonant structures are often grown epitaxially on single crystal substrates. A key requirement is then for a high efficiency reflector buried below the epitaxial active region of the device. Since epitaxial Bragg reflectors are unsuitable for LWIR applications, alternative types of buried reflector must be sought while maintaining the suitability of the substrate to produce high quality epitaxial structures. The reflector on top of the active region can simply be the semiconductor/air interface, or other layers grown epitaxially or deposited after epitaxy.

Single dielectric layers of $SiO_2$, which have a refractive index of about 1.45 over a range of infrared wavelengths (whereas Si has a refractive index of about 3.45 in the infrared), have been suggested and demonstrated as buried reflectors in Si at shorter wavelengths (eg V P Kesan, P G May. F K LeGoues and S S Iyer, J. Cryst. Growth. 111 936 (1991); D K Nayak, N Usami, S Fukatsu and Y Shiraki, Appl. Phys. Lett. 64, 2373 (1994)). SIMOX wafers (separation by implantation of oxygen) were used as substrates. The high quality of Si overlying the oxide allows epitaxial overgrowth of Si and SiGe epilayers. The thickness of buried $SiO_2$ that can be produced in SIMOX wafers is, however, limited.

An alternative technology for the production of high quality buried oxides in Si is that of bond-and-etch silicon on insulator (BESOI), where limitations on thickness are less severe. This is important at longer wavelengths where the thicknesses of $SiO_2$ in the microns may be necessary to produce the required reflectances.

The weak absorption in $SiO_2$ at infrared wavelengths shorter than $7.5 \times 10^{-6}$ m results in a wavelength dependent reflectance for a single layer which exhibits maxima and minima at wavelengths determined by the $SiO_2$ thickness. However, $SiO_2$ exhibits strong phonon absorption bands at about $9.2 \times 10^{-6}$ m and about $21.5 \times 10^{-6}$ m. It is a property of such absorption bands that, in a wavelength region on the short wavelength side of each peak, the refractive index shows a local minimum. As a result of this property, in these spectral regions the reflectance of a single thick $SiO_2$ layer buried in a Si ambient is enhanced compared with wavelength ranges of transparency removed from the absorption bands. In addition, in these spectral regions the reflectance is only weakly dependent on wavelength, and in the important wavelength region $[7.5–9]\times10^{-6}$ m the reflectance is controlled by the oxide thickness, becoming almost independent of oxide thickness for layers $>1.5\times10^{-6}$ m thick. This contrasts with the properties in the shorter wavelength range of dielectric transparency, where the reflectance is a strong function of both thickness and wavelength.

In principle, wafer bonding technology allows use of other buried dielectric layers having absorption bands, and enhanced reflectance, at different wavelengths. Similarly, a resonant cavity using a buried dielectric reflector and a different semiconductor material might be made by bonding that material to a Si wafer with the dielectric on its surface.

BESOI substrates have important advantages for making resonant cavity devices in the $[7.5–9]\times10^{-6}$ m wavelength region. First, a thick ($>1.5\times10^{-6}$ m) oxide layer can be used as the back reflector in the device, giving high reflectance. Secondly, the reflectance of a thick layer is not very sensitive to variations in thickness. Thirdly, the reflectance is reasonably constant over the wavelength region so that strong resonance can be observed even if the cavity width differs slightly from the design value, $L_c$. As a result, the device performance is more tolerant to variations in both oxide thickness and cavity width than would be the case at shorter wavelengths.

Buried layers of $SiO_2$ may also be used as front reflectors with light incident on the $Si/SiO_2$ layer from the substrate side of the cavity. In this case the useful wavelength region of enhanced reflectance near absorption bands will be reduced by absorption of incident light in the $SiO_2$ layer, for which the optimum thickness will be less than for oxide used as a back reflector. Anti-reflection coatings may be used to increase the light entering the substrate.

S Fukatsu, D K Nayak and Y Shiraki, in Applied Physics Letters. 65, 3039 (1994), report the use of single layers of $SiO_2$ to provide reflectors for resonant cavities at wavelengths below $2\times10^{-6}$ m. However, no reference is made to the spectral dependence of the refractive index, n, and extinction coefficient, k. FIG. 2 of this reference shows the reflectance of SiGe/Si epilayers over a single $SiO_2$ layer buried in a Si ambient.

The wavelength dependence of the reflectance exhibits an oscillatory behavior corresponding to two resonances, one in the overlying SiGe/Si layers and one in the $SiO_2$ reflector itself. The latter resonance occurs due to the low value of extinction coefficient in the $SiO_2$ layer which results in light being reflected from the lower $SiO_2$/Si interface to give interference in the $SiO_2$ layer and so a strong wavelength dependence of the layer's reflectance.

Fukatsu et al explain their reflectance results using Si and $SiO_2$ refractive indices of $n_{Si}=3.45$ and $n_{SiO2}=1.45$ respectively and by assuming low absorption (i.e. k is very small). Extending their model to longer wavelengths predicts a continuing oscillatory behavior of the reflectance. In the important wavelength region $[7.5–9]\times10^{-6}$ m their model fails to predict the enhanced magnitude and wavelength-and thickness insensitivities of the reflectance which occur near regions of high k values and which are exploited in the present invention.

SUMMARY OF THE INVENTION

According to this invention a reflector for electromagnetic radiation within a wavelength range comprises a semiconductor substrate of first material, a reflecting layer of second material said second material having a refractive index whose variation with wavelength exhibits at least one local minimum within the range and a layer of third semiconductor material which may be the same or different from the first material;

said layers being arranged so that the reflecting layer is sandwiched between the other two layers.

In a preferred embodiment the second material has an extinction coefficient whose variation with wavelength exhibits at least one local maximum associated with the local minimum in refractive index.

In a further preferred embodiment, the local minima and local maxima arise from a phonon resonance.

In a further preferred embodiment the wavelength range is within $[7.5 \text{ to } 14]\times10^{-6}$ m.

In a further preferred embodiment the wavelength range is within $[7.5 \text{ to } 9]\times10^{-6}$ m.

In a further preferred embodiment the first material is silicon and the second material is silicon dioxide.

In a further preferred embodiment the reflector is incorporated in a resonant cavity.

In a further preferred embodiment, the resonant cavity is incorporated in a detector for electromagnetic radiation.

In a further preferred embodiment the detector includes a multi-quantum well region able to absorb incident radiation, said radiation having an electric field vector with a component which is parallel with the layers and having a wavelength which approximates to the resonant wavelength of the cavity.

BRIEF DESCRIPTION OF THE DRAWINGS

The invention will now be described, by example only, with reference to the following figures in which.

DETAILED DESCRIPTION OF PREFERRED EMBODIMENTS

Figure 1:
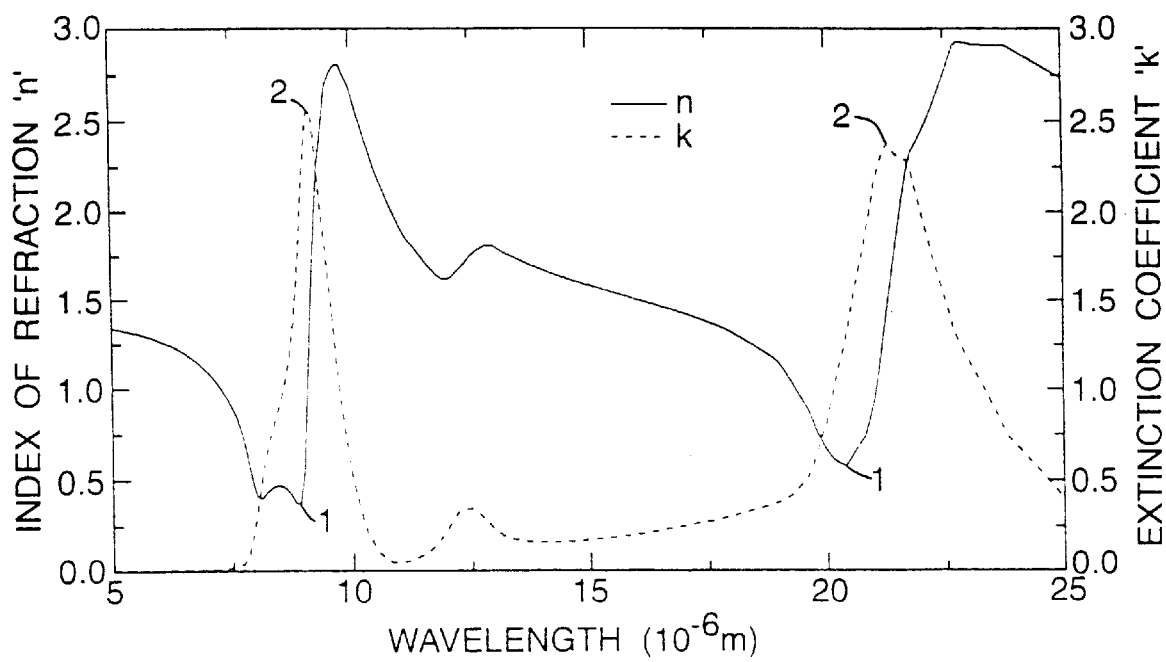
FIG. 1 shows the variation of refractive index and extinction coefficient with wavelength for $SiO_2$.

Referring to FIG. 1, the variation of index of refraction n and extinction coefficient k of $SiO_2$ with wavelength are seen. Localised minima 1 in the refractive index are seen at wavelengths of about $9 \times 10^{-6}$ m and about $20 \times 10^{-6}$ m. Localised maxima 2 in the extinction coefficient are seen at wavelengths of about $9.2 \times 10^{-6}$ m and $21.5 \times 10^{-6}$ m. These data are taken from the Handbook of Optical Constants of Solids. E D Palik (ed.) (Academic Press) (1985).

Figure 2:
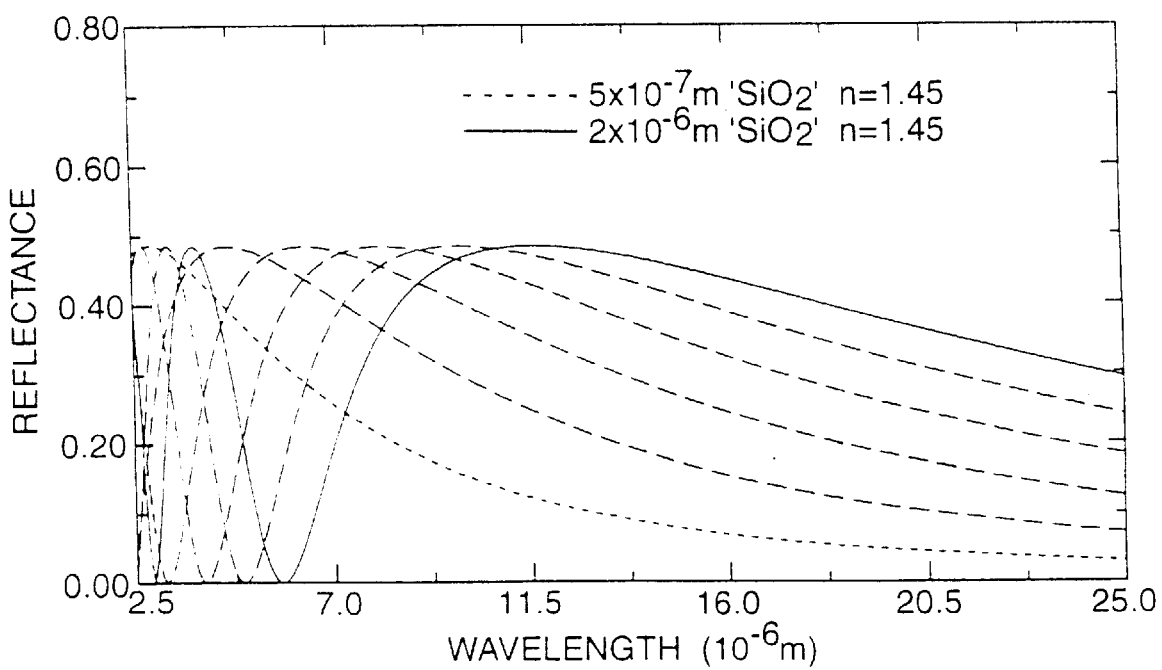
FIG. 2 shows the predicted reflectance of $SiO_2$, in Si ambient, when assumed to be an idealised dielectric with constant refractive index.

FIG. 2 shows the calculated reflectance of $SiO_2$, when assumed to be an idealised dielectric (without localised absorption bands), as a function of wavelength for a range of thicknesses $d_{ox}$ from $5 \times 10^{-7}$ m to $2 \times 10^{-6}$ m. The refractive index is taken as constant and assigned the value characteristic of $SiO_2$ in short wavelength regions of transparency.

For wavelengths within $[7.5–9] \times 10^{-6}$ m the reflectance varies strongly with wavelength and thickness and shows a maximum value of only about 0.5.

Figure 3:
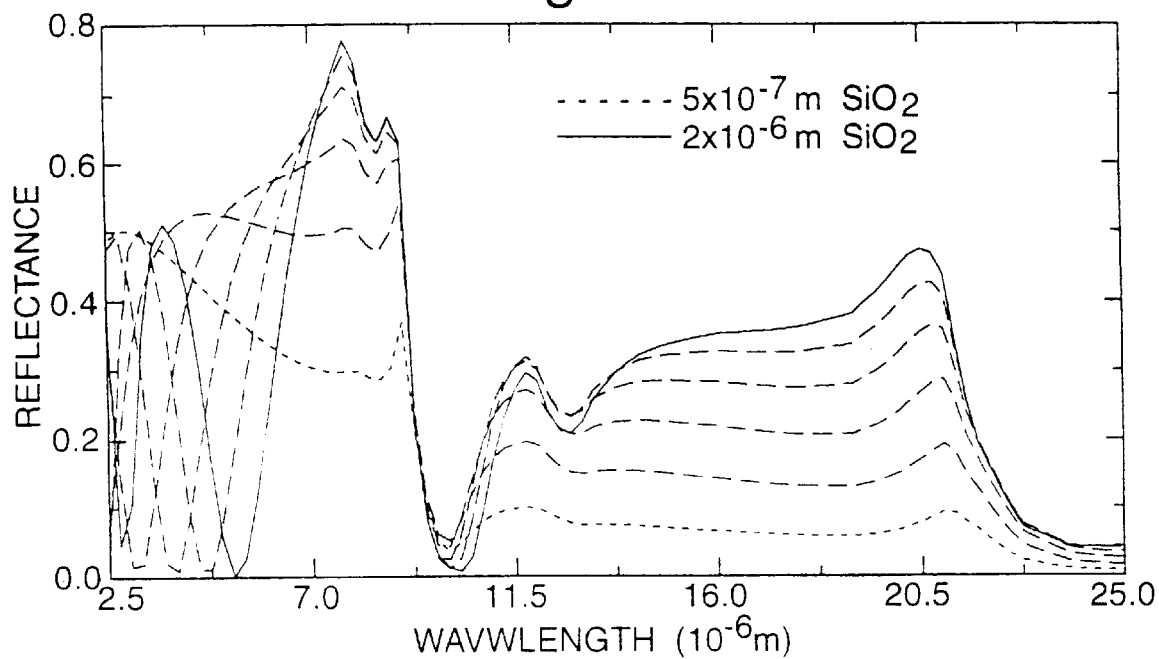
FIG. 3 shows the actual variation of reflectance of $SiO_2$, in Si ambient, with wavelength for a range of thicknesses as calculated from dielectric function spectra.

Referring to FIG. 3, the actual variation of reflectance of $SiO_2$ with wavelength for a range of thicknesses $d_{ox}$ from $5 \times 10^{-7}$ m to $2 \times 10^{-6}$ m is shown. For $d_{ox} > 1.5 \times 10^{-6}$ m, the reflectance of $SiO_2$ is almost independent of the oxide thickness for wavelengths between $[7.5–9] \times 10^{-6}$, with a maximum value of about 0.76 in this wavelength region. These data are calculated using J A Woollam Company, V.A.S.E. Integrated Data Acquisition and Analysis Software for Variable Angle Spectroscopic Ellipsometry, Version 1.3, with reference dielectric function spectra obtained from the Handbook of Optical Constants of Solids referenced above.

Figure 4:
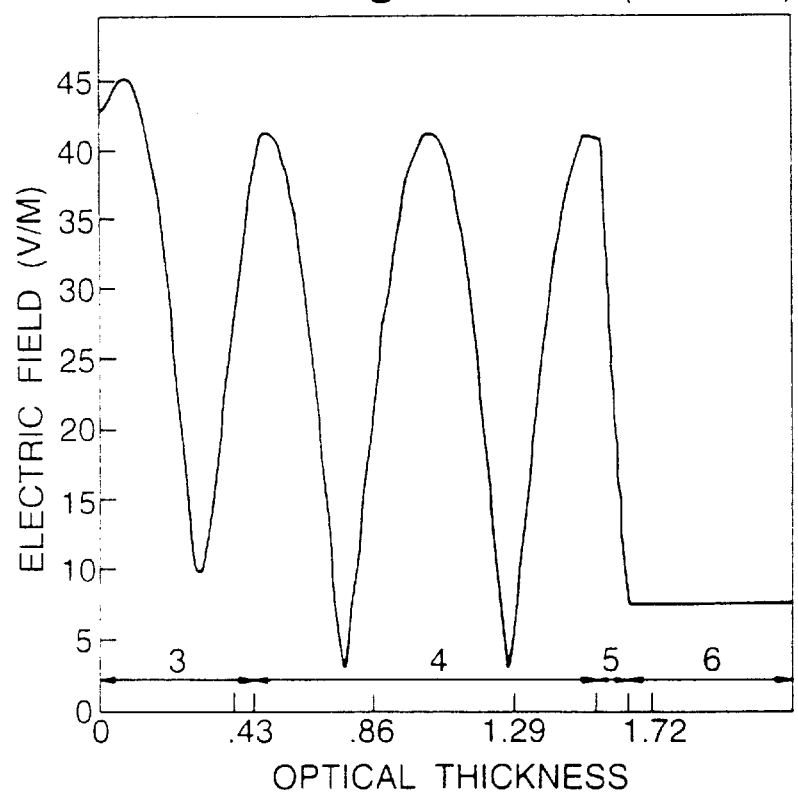
FIGS. 4 and 5 each show the depth dependence of electric field in a structure containing a Si cavity.

FIG. 4 shows the calculated depth dependence of electric field for radiation of wavelength $8 \times 10^{-6}$ m in a $2.4 \times 10^{-6}$ m thick Si cavity. Regions 3, 4, 5 and 6 of the graph correspond to layers of air, silicon, $SiO_2$ and silicon respectively. Thus the front (light incident) reflector is a Si/air interface and the back reflector is a $SiO_2$ ($2 \times 10^{-6}$ m)/Si interface.

The horizontal axis of the graph represents optical thickness, where that of each layer in the structure is given by $n_i d_i / \lambda$, where $n_i$ and $d_i$, are the refractive index and physical thickness of layer i, and $\lambda$ is the resonant wavelength.

Figure 5:
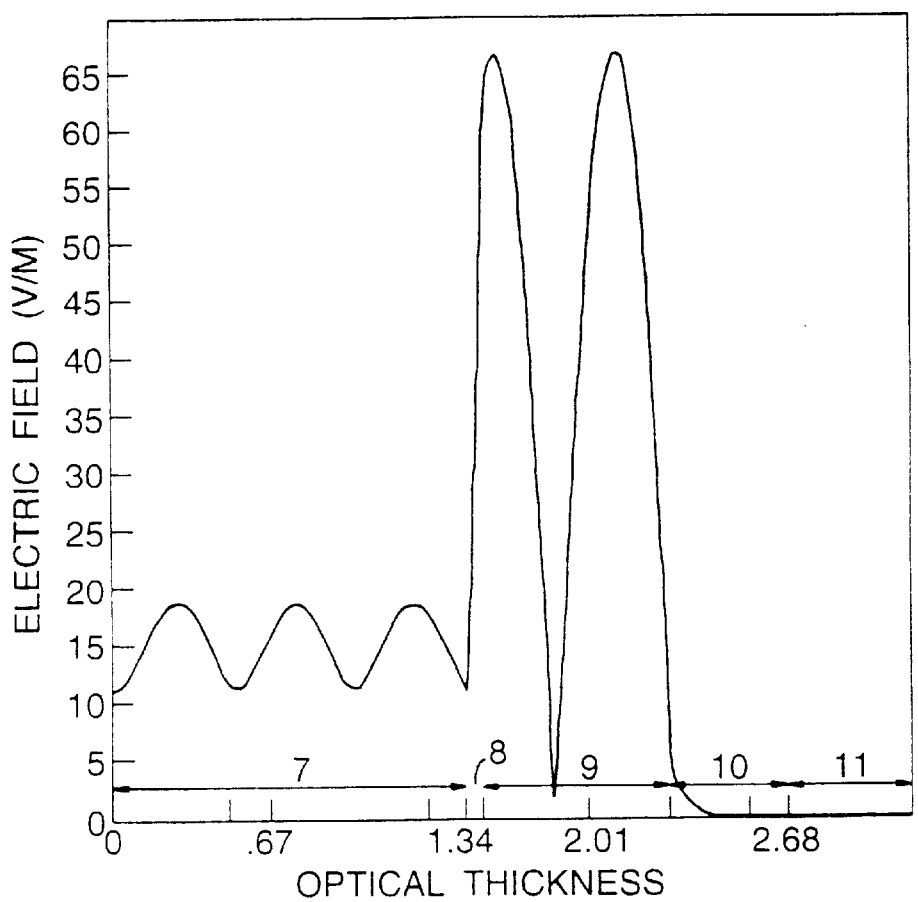

FIG. 5 shows the calculated depth dependence of electric field for radiation of wavelength $8 \times 10^{-6}$ m in a $1.83 \times 10^{-6}$ m thick Si cavity. Regions 7, 8, 9. 10 and 11 of the graph represent layers of silicon, $SiO_2$, silicon, metal and air respectively. Thus the front reflector is a $SiO_2$ ($0.8 \times 10^{-6}$ m)/Si interface and the back reflector is a Si/Al interface.

Calculations to obtain FIGS. 4 and 5 were made using commercial software written by H. A. Macleod (Thin Film Design Software for Apple Macintosh Version 2.1 (1983–1990)) and the reference dielectric function spectra previously referred to.

The use of buried $SiO_2$ reflectors for resonant cavity applications will now be illustrated by a description of the production of a resonant cavity infrared detector for radiation in the range $[7.5–9] \times 10^{-6}$ m. The detector uses multiple p-SiGe/Si quantum wells to absorb the incident radiation and so convert the incident radiative energy into an electrical signal. The purpose of the resonant cavity is to enhance the coupling of the incident light into the absorbing MQW within a desired wavelength range. This is done by locating the MQW in a region of enhanced electric field produced by the resonant cavity. The wavelength of the peak in the MQW absorption, the total cavity width and the reflectors must be chosen carefully to match the incident radiation.

In the present example this was achieved using detailed theoretical modelling to provide the device design and was realised using epitaxial growth of the cavity, including the SiGe/Si MQW and doped electrical contacts, on a commercially purchased BESOI substrate wafer obtained from Shin-Etsu Handotai Co., Ltd.

Simple device structures were then fabricated and their electrical response to spectral radiation measured using the photoconductivity technique. These results were then compared with the optical properties of the resonant cavity measured by spectral reflectance in order to show an enhancement in device performance at the resonant wavelength of the cavity when compared with a non-resonant control device.

The substrate comprised a $2 \times 10^{-6}$ m $SiO_2$ layer buried under a layer of lightly-doped Si (about $10^{-6}$ m). The cavity width was determined by simulating the electric field profiles in the proposed resonant cavity in a similar way to that used to give FIGS. 4 and 5, using the same software package and reference dielectric function spectra previously referred to, and allowing for the effects of doping (in an approximate manner) in both the SiGe and Si layers (D K Schroder, R N Thomas and J C Swartz. IEEE Transactions on Electron Devices, Vol ED-25 No 2 (February 1978) p254).

The design of the MQW was chosen from measurements made on an earlier non-resonant device which gave a photoconductive response to radiation above $5 \times 10^{-6}$ m which cut off between $[10–11] \times 10^{-6}$ m and with a peak in its spectral response around $8 \times 10^{-6}$ m. In one resonant device the top Si/air interface formed the front reflector and the buried oxide formed the back reflector. In this case, finding the total cavity width for resonance at $8 \times 10^{-6}$ m (which includes the MQW, contact layers and Si spacers) was assumed to be equivalent to determining the correct thickness of an antireflection coating on a metal, where the "metal" is $SiO_2$ and the antireflection coating is the cavity above it (see S L Daryanani and G W Taylor, Optical and Quantum Electronics 25 (1993), 123).

This can be done by using the software to minimise the reflectance of monochromatic incident radiation by altering the thickness of the resonant cavity. The thickness chosen was the thinnest cavity in which the contact layers could be accommodated. The active region was a 20-period MQW comprising Si barrier layers about $50 \times 10^{-9}$ m thick and $Si_{0.87}Ge_{0.13}$ quantum wells about $8 \times 10^{-9}$ m thick containing acceptors at a concentration of about $1 \times 10^{16}$ m$^{-2}$.

Figure 6A:
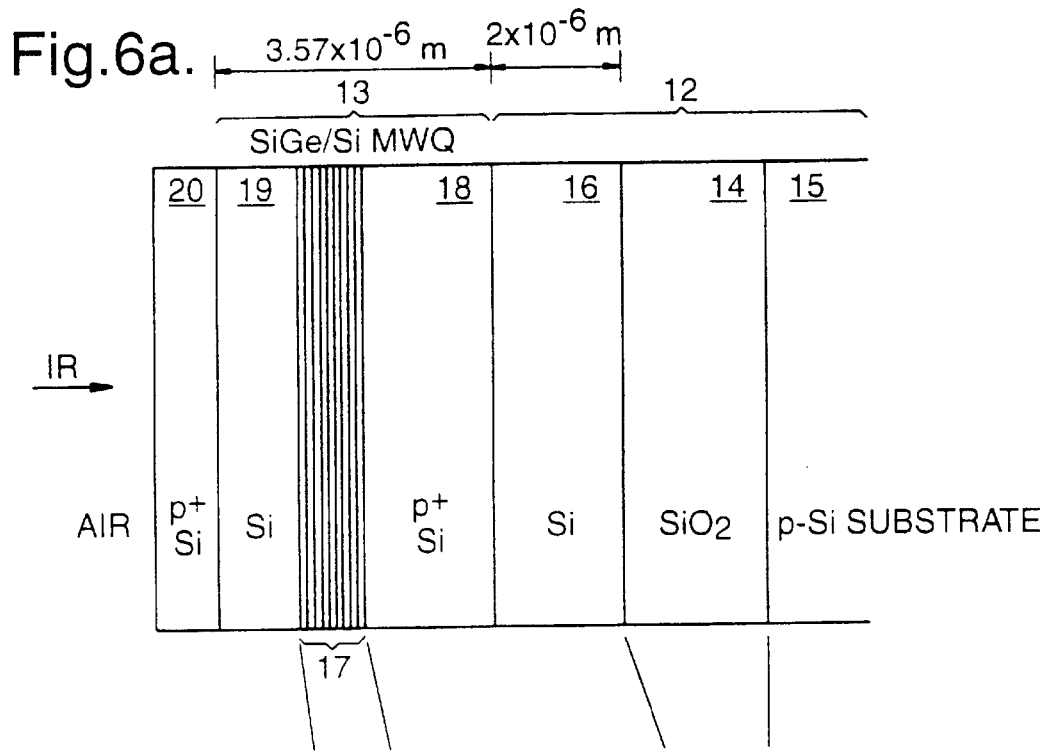
FIG. 6a shows a schematic representation of a resonant cavity detector of the current invention (not to scale) and FIG. 6b shows the depth dependence of electric field of the device.

Referring to FIG. 6a, a multi-quantum well IR resonant cavity detector featuring a reflector of the current invention comprises a BESOI region 12 and a multi-quantum well region 13. Region 12, in turn, comprises a reflector layer 14 of $SiO_2$ sandwiched between a p$^-$ doped Si substrate 15 and a Si layer 16 which is suitable for further epitaxial growth.

Region 13 comprises multiple layers of SiGe/Si 17 sandwiched between a p$^+$ doped Si layer 18 and a layer of Si 19 suitable for further epitaxial growth. This is topped with a layer 20 of p$^+$ doped silicon suitable for the attachment of an electrical contact (not shown). Optimum resonant enhancement is achieved with radiation of suitable wavelength normally incident on the top surface (Si/Air) surface, but absorption will be enhanced for radiation at non-normal incidence which is refracted close to the normal inside the cavity.

Figure 6B:
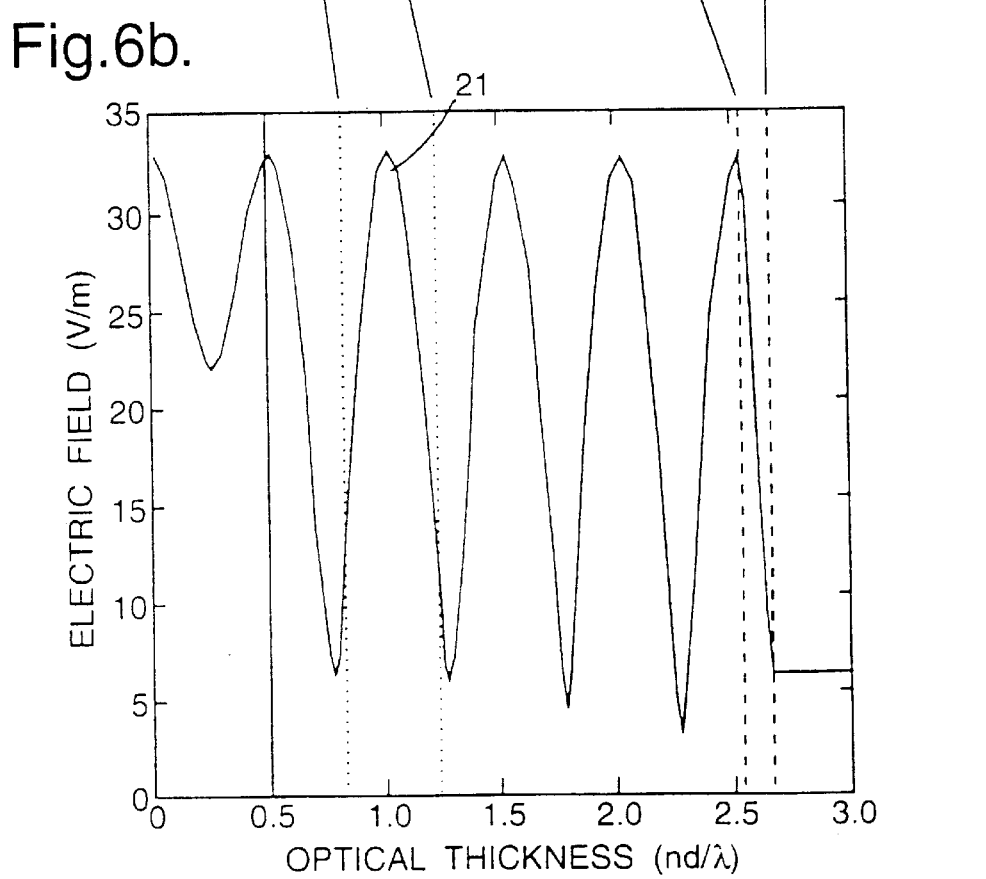

Referring to FIG. 6b, the electric field profile of the device of FIG. 6a, as obtained using the commercial software previously referred to, is shown.

As in FIGS. 4 and 5, the horizontal axis represents optical thickness.

The maximum in the electric field is attenuated by approximately 25% by absorption in the contact layers and has a peak magnitude between 30Vm$^{-1}$ and 35Vm$^{-1}$. The peak electric field in an equivalent Si substrate is about 12.5Vm$^{-1}$, indicating an enhancement in the electric field intensity of between 5 and 8 times, as given by the square of the ratio of the electric fields in the resonant and non-resonant cases. In this example peak 21 is coincident with the Multi Quantum Well region 17 shown in FIG. 6$a$.

Figure 7:
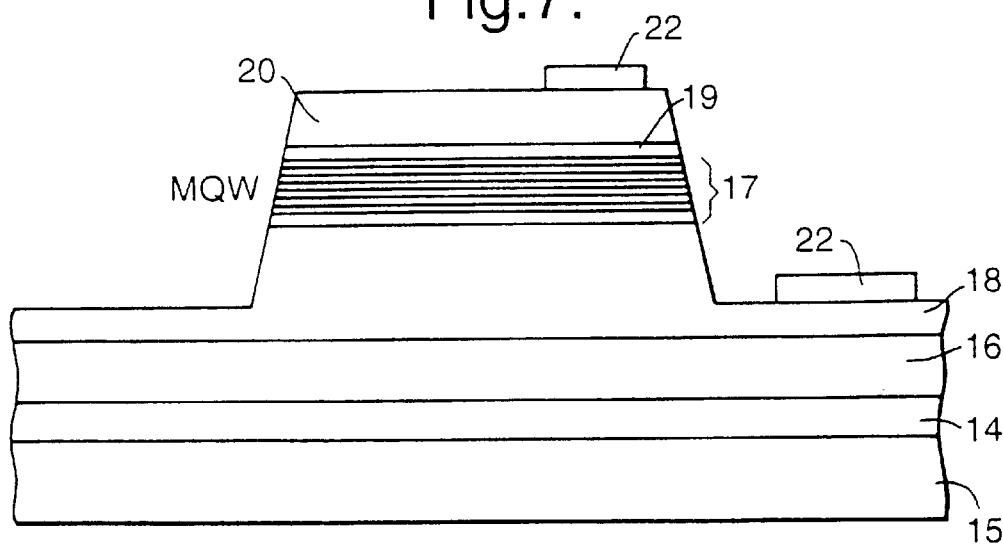
FIG. 7 shows a second representation of a resonant cavity detector of the current invention (not to scale)

Referring to FIG. 7, like numerals are used to represent layers which correspond with those shown in FIG. 6$a$. Aluminium electrical contacts 22 are fixed to p$^+$ doped layers 18 and 20.

A second resonant device was made to detect radiation normally incident from the substrate side, using the same epitaxial structure. In this case the 2×10$^{-6}$ m buried oxide formed the front reflector for the cavity, and Al was deposited on the top Si surface of the epitaxial layers to form the back reflector. The surface of the substrate exposed to the incident radiation was polished to improve transmission, but no anti-reflection coating was applied.

An equivalent active MQW and contact structure was epitaxially grown on a p$^+$-Si substrate and used to make a non-resonant control device.

The active device layers were grown by Low Pressure Vapour Phase Epitaxy (LPVPE) in a stainless steel reactor with ultra-highvacuum background. The source gases used were silane and germane for growth of the Si and SiGe epilayers with diborane included for the p-type doping. These were mixed with hydrogen, typically at pressures of 13–130 Pa. Surface oxide was desorbed at 900–920° C. and a 5×10$^{-8}$ m Si buffer was deposited at 750° C. Growth of the device layers was nominally at 610° C.

Figure 8:
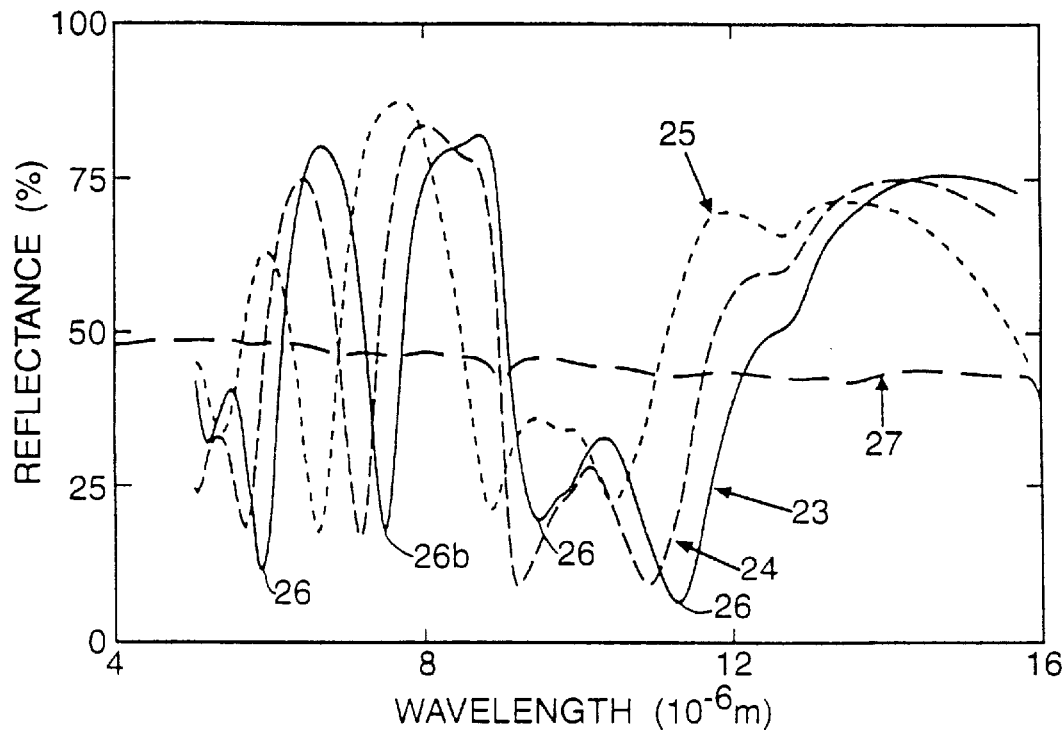
FIG. 8 shows reflectance spectra for IR radiation normally incident on the top surface of a resonant cavity and a control device.

Referring to FIG. 8 the presence of optical resonance in the device cavity was established by observing minima in the spectral reflectance of the device. Reflectance spectra on as-grown resonant cavity and control devices were measured using a Perkin-Elmer 983G infrared spectrophotometer with gold as 100% standard. Light normally incident on the top surface was used and spectra were taken from the centre 23, centre+0.01 m 24 and centre+0.02 m 25 of the wafer. Wavelengths where resonance occurs were identified as those regions 26 where the reflectance of the resonant cavity was below that of the control 27. As the location of the measurement is moved further from the centre of the resonant device wafer the resonances shift to lower wavelength.

This is due to a change in the cavity width across the substrate caused by a radial variation in the wafer temperature during growth.

Both the presence of multiple resonances and their tunability using the width of the resonant cavity are demonstrated in FIG. 8.

The device design was intended to give a cavity resonance centred at 8×10$^{-6}$ m near the middle of the substrate. In FIG. 8 this is seen to have shifted to 7.25×10$^{-6}$ m 26$b$. This is due to the presence of the buried SiO$_2$ layer in the substrate which alters the emissivity of the BESOI wafer compared with a bulk Si substrate. The emissivity is used to measure the wafer temperature during epilayer deposition and so the resonant cavity device was grown at a temperature slightly below the intended 610° C. As a result the cavity is thinner than intended which gives a resonance at shorter wavelength.

The thickness of the cavity near the centre of the substrate was measured by modelling the reflectance spectra using the commercial software previously described with the layer refractive indices for undoped Si and SiO$_2$ used to give the device design. The thickness obtained was about 3.2×10$^{-6}$ m, and was 0.37×10$^{-6}$ m less than the design value. Using this revised cavity thickness the electric field profile in the device structure was modelled at each of the wavelengths where reflectance minima were observed. All gave rise to an enhanced electric field in the cavity due to resonance, the greatest enhancement being at 7.25×10$^{-6}$ m.

In order to reposition the principal resonance for top surface illumination within the desired wavelength range [7.5–9]×10$^{-6}$ m, it is simply necessary to adjust the epitaxial growth conditions to produce a cavity of thickness 3.57×10$^{-6}$ m. Alternatively, the resonance phase conditions within the thinner cavity can be changed by illuminating from the substrate side and using an Al back reflector deposited on the top Si surface.

The corresponding cavity resonance close to the middle of the wafer is then centred near 7.8×10$^{-6}$ m.

In order to demonstrate the operation of resonant cavity detectors based on these principles, simple photoconductive devices were fabricated from both the resonant cavity and control samples. The devices were mesa structures with the electrical contacts made using evaporated Al. The following steps were used to produce the working cavity device with oxide back reflector and the control device for top surface illumination:

i) A piece of each sample, obtained by cleaving the wafers, had its surface oxide removed using dilute HF solution. This step is repeated before mesa etching and before Al evaporation. The sample may be immersed in methanol to inhibit surface reoxidation prior to subsequent process steps.

ii) Wax dots were then applied to the surface to form etch masks of about 2 mm diameter. These define the mesa area.

iii) Approximately 3×10–6 m high mesas were formed using an aqueous etch comprising 30 ml 0.825M Cr$_2$O$_3$ solution and 20 ml 40% HF.

iv) The wax masks were removed and Al evaporated on to the sample surface.

v) Two wax dots were then applied to the Al to define two electrical contacts. On each device, one contact is on top of the mesa surface leaving the majority of the mesa area clear to allow the incident light to enter the cavity. The second is on the etched surface to make electrical contact below the MQW active region.

vi) Al etch was then used to remove the unwanted Al. The wax was then removed.

vii) The samples were then heated at 385° C. for 5 minutes in a nitrogen atmosphere to give ohmic contacts by alloying in the Al.

viii) The samples were then mounted on individual packages and electrical contact was made by ball bonding the Al contacts to the appropriate part of the package.

Referring to FIG. 9$a$, photoconductivity measurements of the resonant cavity and control devices with top surface illumination were made at a temperature of 20K. Relative responsivity spectra were obtained by dividing the spectral response of each sample to monochromatic infrared radiation by the response to the same radiation of a pyroelectric detector which is assumed to have a constant response over the wavelength range of interest.

The monochromatic radiation was provided by a globar source passed through a grating monochromator and an appropriate long pass filter. The radiation was chopped. The electrical signal from the sample was fed, via a preamplifier into a lock-in amplifier with the chopper frequency of the incident radiation used as reference frequency. The signal from the pyroelectric was fed directly into the lock in amplifier. The spectral dependence of the lock-in output was recorded as the raw photoconductivity spectrum.

Figure 9A:
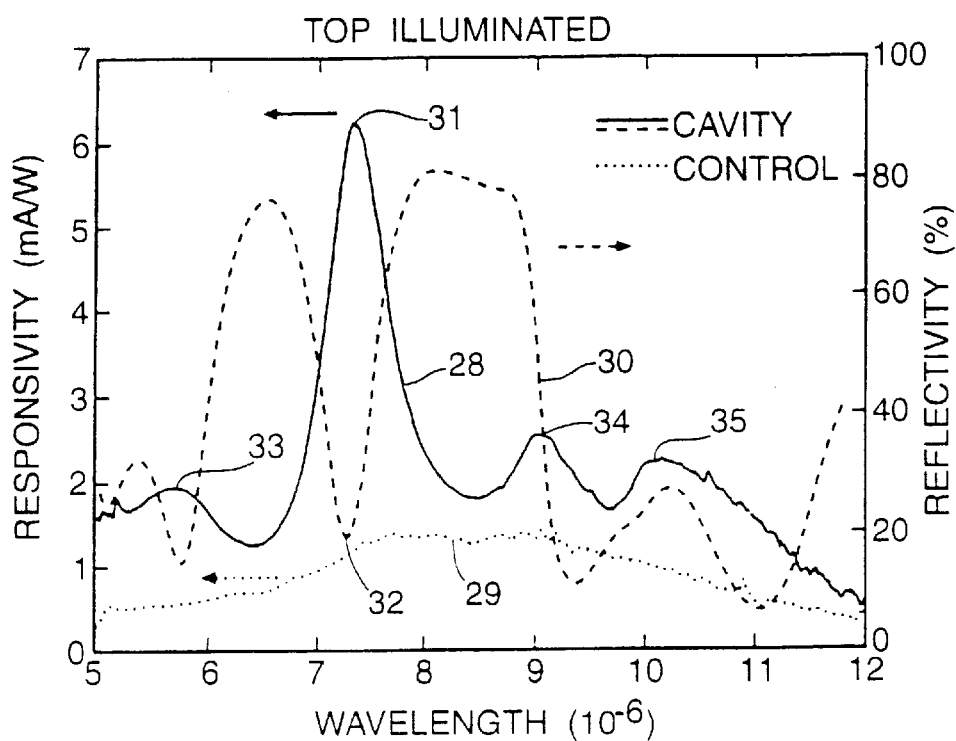
FIG. 9a shows absolute responsivity spectra for the resonant cavity detector and control illuminated from the top surface and reflectance for the resonant device.

Absolute responsivity spectra were obtained from the relative responsivity using a photocurrent measurement with a 500K black body oven. Absolute responsivity spectra for both the resonant cavity device 28 and the control 29 are shown in FIG. 9a where they are compared with the reflectance 30 from the resonant cavity sample. This figure clearly demonstrates an infrared detector with resonantly enhanced operation. A peaked structure and a strong enhancement in responsivity are seen for the resonant cavity device when compared with the control sample.

The $7.25 \times 10^{-6}$ m peak 31 in responsivity of the resonant cavity device can be seen to be caused by cavity resonance of incident radiation of this wavelength by comparison with the reflectance measured on the same structure. A local minimum 32 in reflectance is seen at that wavelength. The responsivity peak 31 due to resonance is stronger than peaks 33, 34, and 35 at other wavelengths due to the enhanced reflectance of the $SiO_2$ reflector associated with the local minimum in its refractive index.

The following steps were used to produce a working cavity device with Al back reflector and buried oxide front reflector for substrate-side illumination:

i) A piece of the resonant cavity sample on the BESOI substrate had the rough bottom surface of the substrate polished to improve transmission. This polished surface was protected by wax.

ii) Oxide was removed from the top surface using dilute HF solution. This step is repeated before mesa etching and before Al evaporation. The sample may be immersed in methanol to inhibit surface reoxidation prior to subsequent process steps.

iii) Al was evaporated on the top surface and wax dots were then applied to the surface to form etch masks of about 2 mm diameter. These defined the mesa area and the top contact covering the whole of that area.

iv) The exposed Al was etched away and approximately $3 \times 10^{-6}$ m high mesas were formed using an aqueous etch comprising 30 ml 0.825M $Cr_2O_3$ solution and 20 ml 40% HF.

v) A second Al layer was evaporated onto the surface and a wax dot applied to the etched area to define the bottom contact.

Steps vi), vii) and viii) described above were then followed, with the addition that a hole was drilled in the mounting package to allow illumination from the polished substrate side.

Figure 9B:
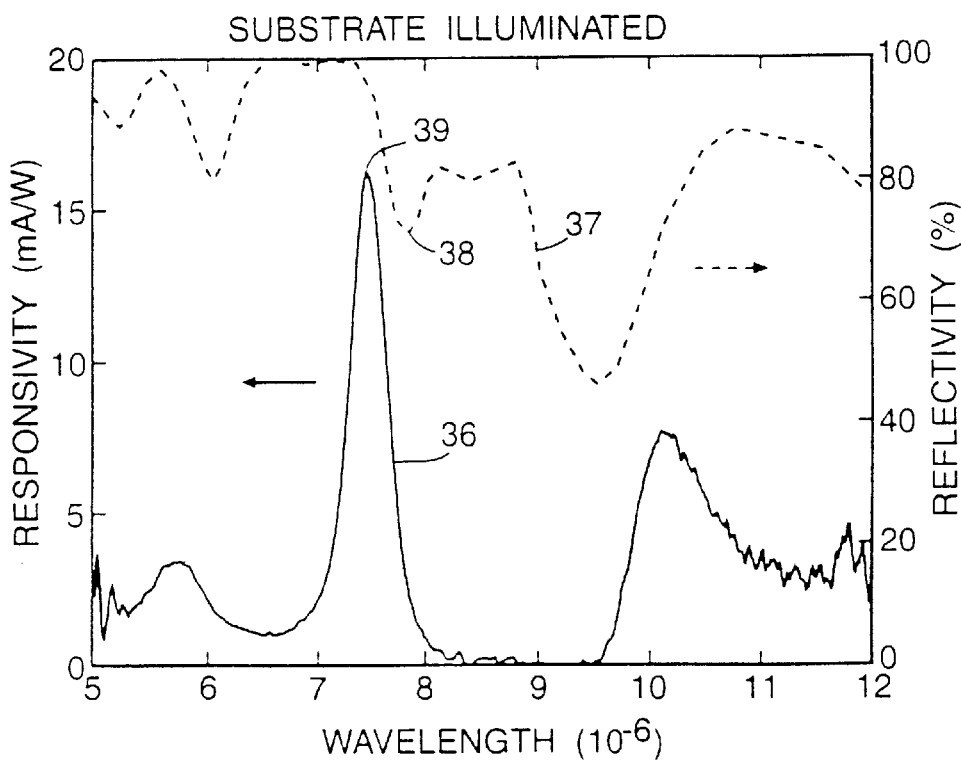

Referring to FIG. 9b, absolute responsivity measurements 36 made as described for FIG. 9a at 20K are compared with reflectance spectra 37 for substrate-side illumination of the resonant cavity. The reflectance 37 is greater than in FIG. 9a largely due to the highly reflective Al back layer. There is a minimum in reflectance 38 at $7.8 \times 10^{-6}$ m which shows that the combination of $SiO_2$ front reflector and Al back reflector has moved the cavity resonance to longer wavelength compared with the minimum 32 in FIG. 9a.

The photoconductive responsivity 36 in FIG. 9b associated with the cavity resonance shows a peak 39 at $7.5 \times 10^{-6}$ m, within the desired wavelength range. The absolute magnitude of this peak responsivity is greater than for the peak 31 in the top illuminated cavity device in FIG. 9a, due to the greater enhancement of electric field intensity for the $SiO_2$/Si and Si/Al reflector pair compared with the $SiO_2$/Si and Si/air reflector pair.

This effect is evident in the higher calculated peak electric field within the cavity in FIG. 5 compared with FIG. 4.

The responsivity peak 39 in FIG. 9b does not occur at the same wavelength as the minimum 38 in reflectivity 37, due to attenuation of the incident light by absorption in the $2 \times 10^{-6}$ m thick front $SiO_2$ reflector. Further enhancement of peak responsivity should be achievable by optimisation of the dielectric front reflector in this configuration.

Figure 10:
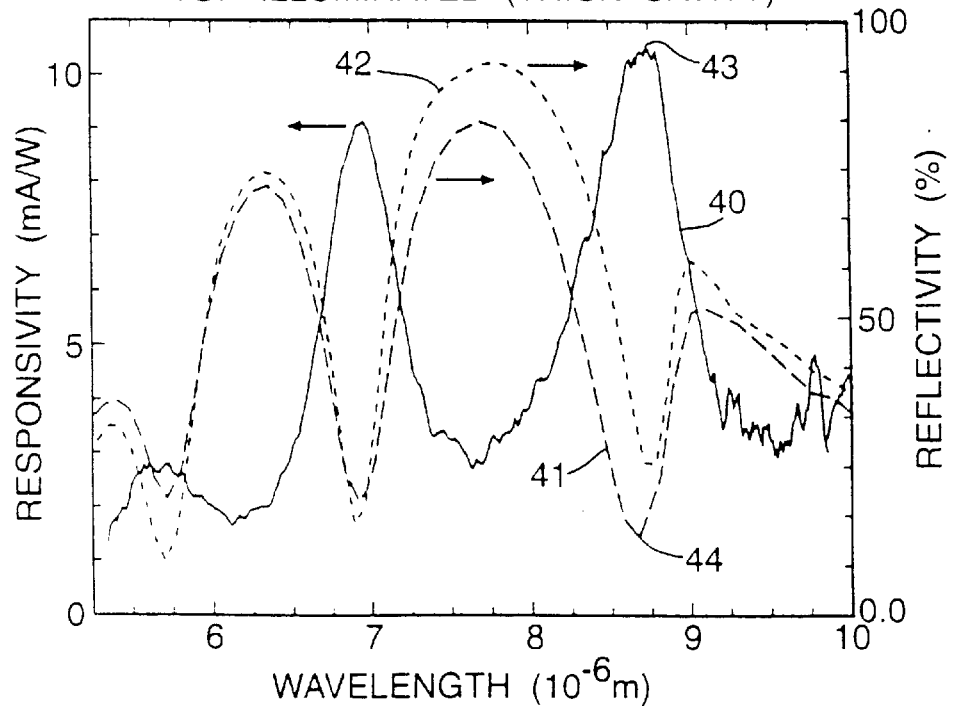
FIG. 9b shows absolute responsivity spectra and reflectance for a resonant cavity detector illuminated from the substrate side and FIG. 10 shows the absolute responsivity and reflectance spectra for a second resonant cavity detector designed to provide a peak in responsivity in the useful wavelength range of $[8–9]\times10^{-6}$ m.

FIG. 10 shows photoconductivity measurements for another device fabricated in a similar fashion to that from which FIG. 9a was derived. This device had a cavity thickness of approximately $4.1 \times 10^{-6}$ m and was illuminated at the top surface. The absolute responsivity spectrum 40 of the device is shown along with both measured reflectivity 41 and simulated reflectivity 42 (by similar methods to that described previously). Measurements were made at 2V bias.

FIG. 10 shows the device to have a peak 43 in responsivity in the useful wavelength range of $[8-9] \times 10^{-6}$ m. Peak 43 is coincident with a minimum 44 in reflectivity.

What is claimed is:

1. A reflector for electromagnetic radiation within a wavelength range of $(7.5$ to $14) \times 10^{-6}$ m, said reflector comprising:

a semiconductor substrate;

a reflecting layer of material having a refractive index whose variation with wavelength exhibits at least one local minimum within the range and an extinction coefficient whose variation with wavelength exhibits at least one local maximum associated with the local minimum in refractive index, and a further layer of semiconductor material;

said substrate and layers being arranged so that the reflecting layer is sandwiched between the substrate and said further layer.

2. The reflector of claim 1 where the local minimum and local maximum arise from a phonon resonance.

3. The reflector of claim 2 where the wavelength range is within $[7.5$ to $9] \times 10^{-6}$ m.

4. The reflector of claim 3 where the substrate is silicon and the reflecting layer is silicon dioxide.

5. A resonant cavity incorporating reflector according to claim 1.

6. A detector of electromagnetic radiation incorporating a resonant cavity according to claim 5.

7. A detector according to claim 6 and further including a multiquantum well region able to absorb incident radiation, said radiation having an electric field vector with a component which is parallel with the layers and having a wavelength which approximates to the resonant wavelength of the cavity.

* * * * *